United States Patent
Pahkala et al.

(10) Patent No.: US 11,177,738 B1
(45) Date of Patent: Nov. 16, 2021

(54) DIGITAL ON-TIME GENERATION FOR BUCK CONVERTER

(71) Applicant: TEXAS INSTRUMENTS INCORPORATED, Dallas, TX (US)

(72) Inventors: Janne Matias Pahkala, Oulu (FI); Juha Olavi Hauru, Oulu (FI)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/945,499

(22) Filed: Jul. 31, 2020

(51) Int. Cl.
    *H02M 3/157* (2006.01)
    *H03K 5/26* (2006.01)
    *H03K 5/24* (2006.01)
    *G04F 10/00* (2006.01)

(52) U.S. Cl.
    CPC .......... *H02M 3/157* (2013.01); *G04F 10/005* (2013.01); *H03K 5/24* (2013.01); *H03K 5/26* (2013.01)

(58) Field of Classification Search
    None
    See application file for complete search history.

(56) References Cited

U.S. PATENT DOCUMENTS

| | | | | |
|---|---|---|---|---|
| 6,008,703 | A * | 12/1999 | Perrott | H03C 3/0925 331/16 |
| 8,552,775 | B2 | 10/2013 | Lee et al. | |
| 10,199,937 | B1 * | 2/2019 | Hauru | H02M 3/158 |
| 10,333,403 | B2 | 6/2019 | Huang et al. | |
| 2008/0122544 | A1 | 5/2008 | Wang | |
| 2008/0197830 | A1 * | 8/2008 | Mehas | H03L 7/0992 323/318 |
| 2009/0256601 | A1 | 10/2009 | Zhang et al. | |
| 2014/0184180 | A1 | 7/2014 | Kronmueller | |

(Continued)

FOREIGN PATENT DOCUMENTS

JP      6328264 A      5/1988

OTHER PUBLICATIONS

Li et al., "A 90-240 MHz Hysteretic Controlled DC-DC Buck Converter With Digital Phase Locked Loop Synchronization," IEEE Journal of Solid-State Circuits, vol. 46, No. 9, Sep. 2011, 12 pages.

(Continued)

*Primary Examiner* — Cassandra F Cox
(74) *Attorney, Agent, or Firm* — Michael A. Davis, Jr.; Charles A. Brill; Frank D. Cimino

(57) ABSTRACT

An apparatus includes a phase frequency detector having a detector output and first and second inputs, the phase frequency detector configured to provide a phase difference signal at the detector output responsive to the first and second inputs. The apparatus also includes a gain controller having a controller input and a controller output, the controller input coupled to the detector output, and the gain controller configured to provide a digital value at the controller output responsive to the phase difference signal and a duty cycle. The apparatus also includes a pulse generator having a generator output and first and second generator inputs, the first generator input coupled to the controller output, the second generator input coupled to the second detector input, the pulse generator configured to provide a generator signal at the generator output responsive to the digital value and the second generator input.

20 Claims, 11 Drawing Sheets

(56) References Cited

U.S. PATENT DOCUMENTS

2015/0280556 A1 10/2015 Bari et al.
2016/0336848 A1 11/2016 Meola et al.

OTHER PUBLICATIONS

Krishnamurthy et al., "A 500 MHz, 68% efficient, Fully On-Die Digitally Controlled Buck Voltage Regulator on 22nm Tri-Gate CMOS," 2014 Symposium on VLSI Circuits Digest of Technical Papers, Jun. 2014, 2 pages.
Krishnamurthy et al., "A Digitally Controlled Fully Integrated Voltage Regulator With 3-D-TSV-Based On-Die Solenoid Inductor With a Planar Magnetic Core for 3-D-Stacked Die Applications in 14-nm Tri-Gate CMOS," IEEE Journal of Solid-State Circuits, 2017, 11 pages.
International Search Report for PCT/US19/51558, dated Dec. 5, 2019, 1 page.

* cited by examiner

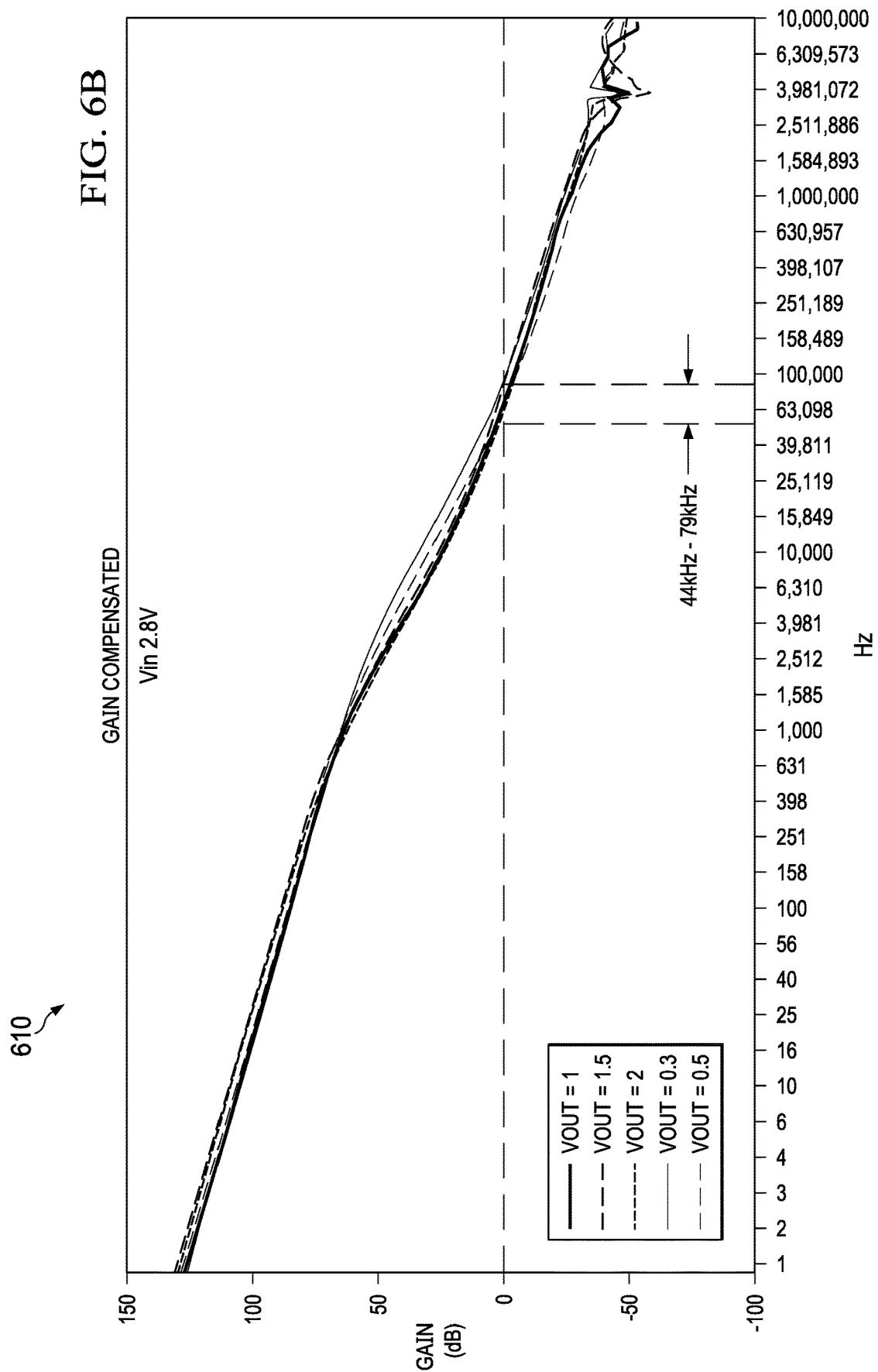

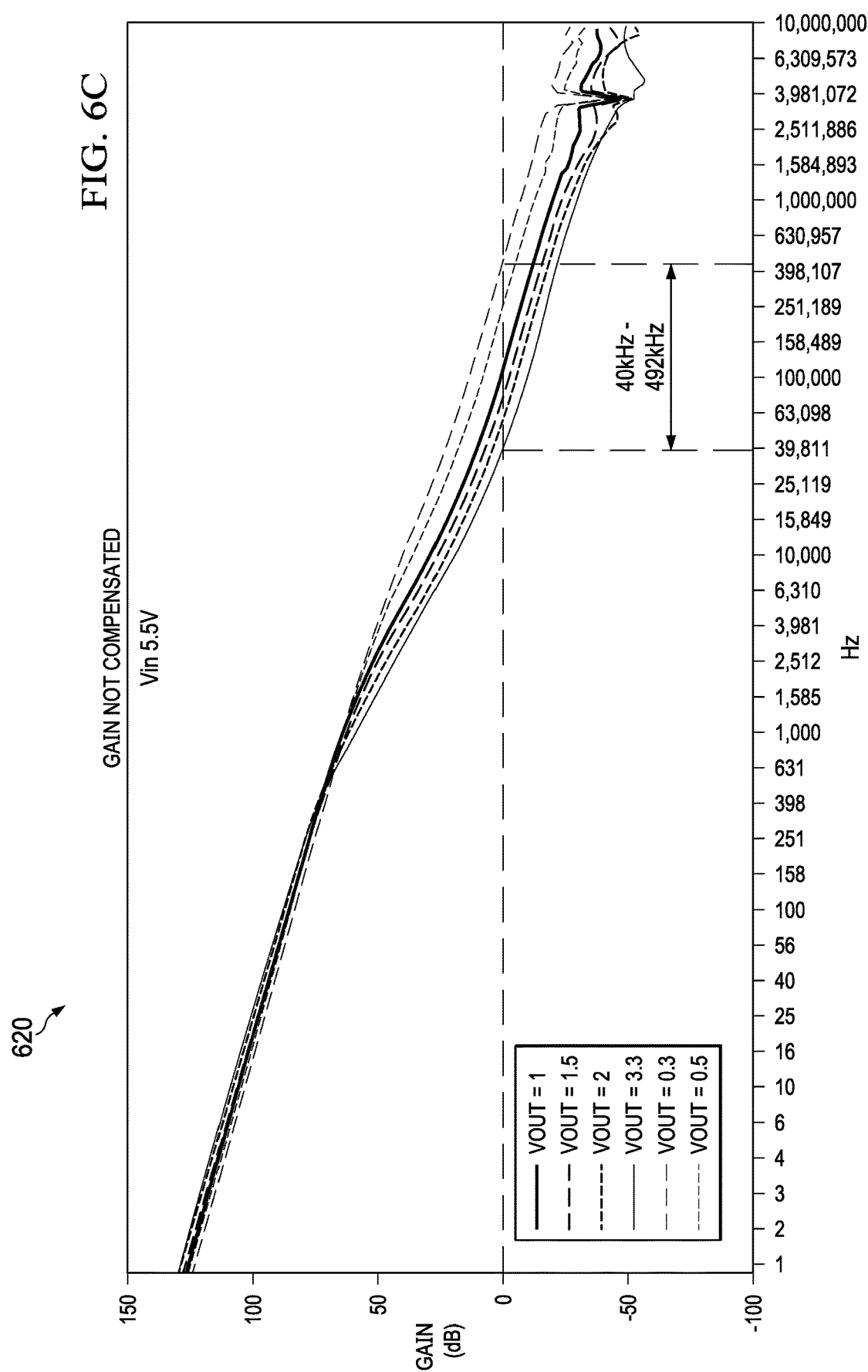

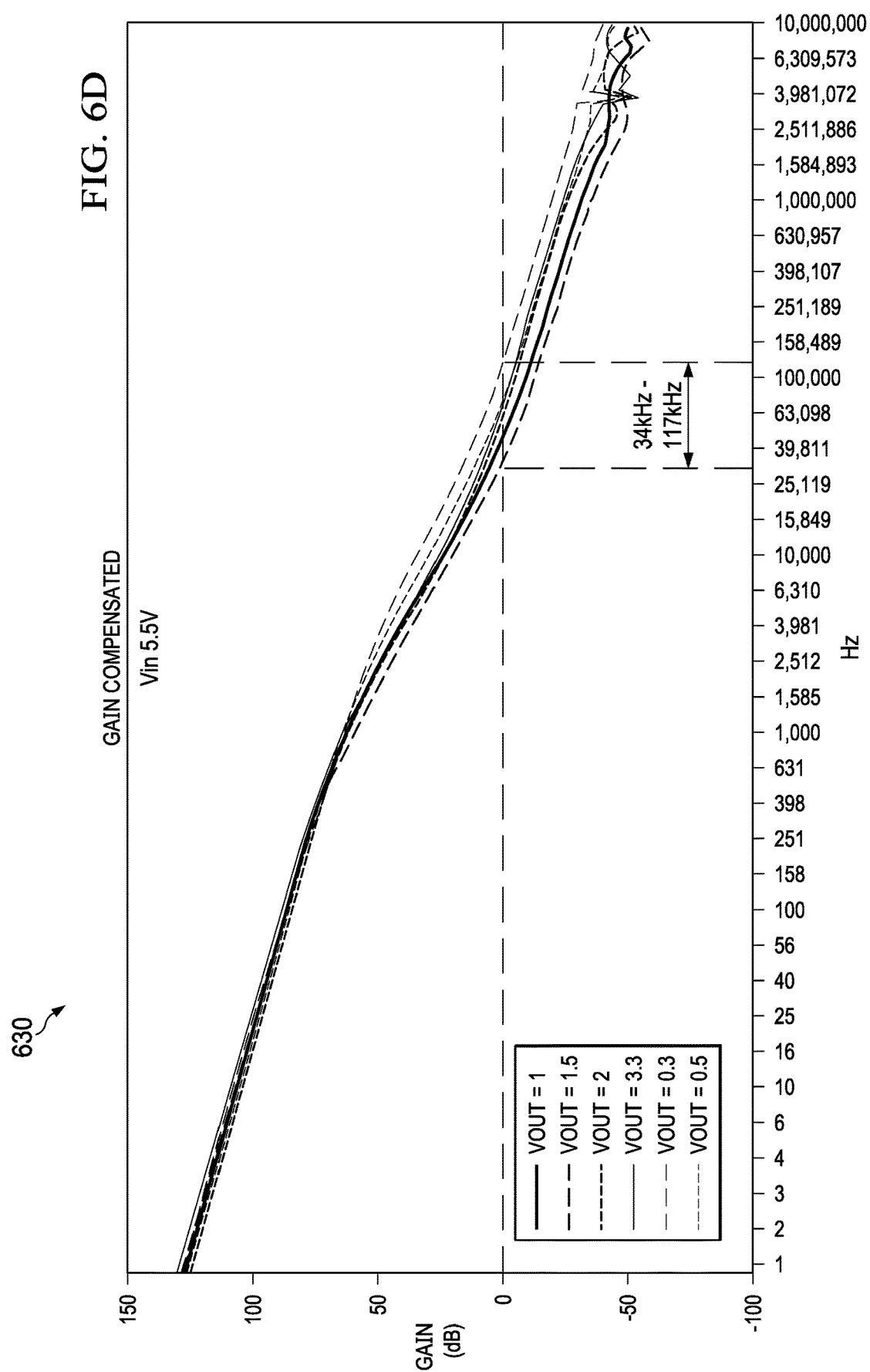

DIGITAL ON-TIME GENERATION FOR BUCK CONVERTER

BACKGROUND

A power converter is a circuit that is useful in various devices. An example buck converter converts an input voltage into a lower output voltage by controlling transistors and/or switches to charge and/or discharge inductors and/or capacitors to maintain the programmed output voltage. In one case, buck converters in automotive applications are useful to reduce an input voltage to an output voltage responsive to the input voltage rising above the output voltage, because of alternator operation or other events causing a voltage spike.

SUMMARY

In at least one example, an apparatus includes a phase frequency detector having a detector output and first and second inputs, the phase frequency detector configured to provide a phase difference signal at the detector output responsive to the first and second inputs. The apparatus also includes a gain controller having a controller input and a controller output, the controller input coupled to the detector output, and the gain controller configured to provide a digital value at the controller output responsive to the phase difference signal and a duty cycle. The apparatus also includes a pulse generator having a generator output and first and second generator inputs, the first generator input coupled to the controller output, the second generator input coupled to the second detector input, the pulse generator configured to provide a generator signal at the generator output responsive to the digital value and the second generator input.

In another example, a system includes a power stage of a voltage converter and an apparatus coupled to the power stage. The power stage includes a high-side switch adapted to be coupled to an input voltage source, a low-side switch coupled to the high-side switch and to a ground terminal, and a control circuit configured to control the high-side switch and the low-side switch. The apparatus includes a phase frequency detector having a detector output and first and second inputs, the phase frequency detector configured to provide a phase difference signal at the detector output responsive to a reference clock signal received at the first input and a high-side ON signal received at the second input, the high-side ON signal also provided to the control circuit. The apparatus also includes a gain controller having a controller input and a controller output, the controller input coupled to the detector output. The gain controller is configured to provide a first digital value at the controller output based on the phase difference signal and provide a second digital value at the controller output based on the phase difference signal and a duty cycle of the voltage converter. The apparatus also includes a first pulse generator having first and second inputs and an output, the first input of the first pulse generator coupled to the controller output, the second input of the first pulse generator adapted to receive the high-side ON signal, the first pulse generator configured to provide a first generator signal at the first pulse generator output responsive to the high-side ON signal and the first digital value. The apparatus also includes a second pulse generator having first and second inputs and an output, the first input of the second pulse generator coupled to the controller output, the second input of the second pulse generator coupled to the output of the first pulse generator, the second pulse generator configured to provide a second generator signal at the second pulse generator output responsive to the first generator signal and the second digital value.

In yet another example, a method of controlling a voltage converter includes determining a phase difference between a first signal and a second signal; determining a duty cycle of the voltage converter; generating a digital value based on the phase difference and the duty cycle; and controlling an ON-time of a switch of the voltage converter based on the digital value.

BRIEF DESCRIPTION OF THE DRAWINGS

FIGS. 6A-6D are graphs showing various waveforms that demonstrate the reduction in frequency response variation that results from control loop gain adaptation in accordance with various examples.

DETAILED DESCRIPTION

Figure 1:
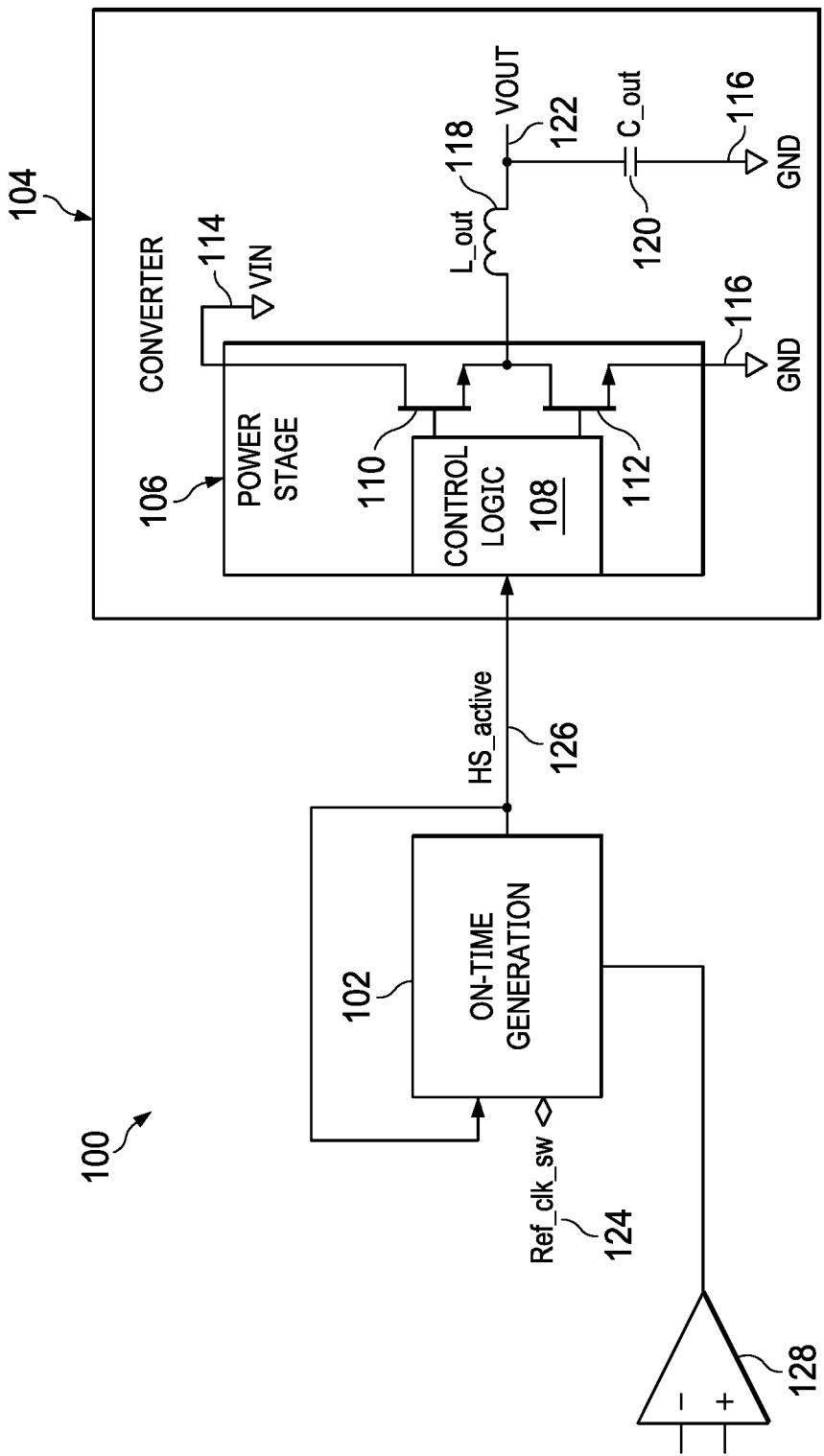
FIG. 1 is a schematic diagram of an adaptive ON-time generation (OTG) system in accordance with various examples.

Switched mode power converters (e.g., boost converters, buck converters, buck-boost converters, etc.) are useful to convert a first voltage (e.g., an input voltage) to a second voltage (e.g., an output voltage). Such power converters include a switching network including one or more switching transistors coupled to a switching node that is switched to direct current through an energy storage inductor and/or to charge/discharge an output capacitor. The inductor and/or capacitor supply load current and regulate the output voltage to the second voltage. The switching network can include one or more drivers coupled to the control terminals of switching (power) transistors, such as to the gates of bipolar junction transistors (BJTs) or field-effect transistors (FETs).

Buck converters are efficient in maintaining an output voltage at low switching frequencies, but efficiency decreases with an increase in switching frequency. For example, switching loss is proportional to switching frequency. In such cases, a maximum conversion ratio is lower and a dropout voltage is higher. In some buck converter implementations, synchronization of the buck converter regulator to an external clock maintains the system within a predictable set of frequencies. In some buck converters, the external clock synchronization is implemented with an adaptive ON-time generation (OTG) architecture. The OTG architecture synchronizes the buck converter regulator with the external clock by controlling the ON-time of a high-side switch (e.g., a high-side power transistor on a primary side of a transformer) of the buck converter.

In certain applications, the buck converter is configured to operate across a relatively wide range of duty cycles. For example, in automotive applications, the range of input voltages is from approximately 2.8V to approximately 5.5V, while the range of output voltages is from approximately 0.3V to approximately 3.34V. Thus, the buck converter is configured to operate at a relatively high duty cycle responsive to the difference between the input voltage and the output voltage being relatively small, and at a relatively low duty cycle responsive to the difference between the input voltage and the output voltage being relatively large.

As described further below with respect to FIG. 2, the frequency of the buck converter is more sensitive to changes in ON-time at low duty cycles than at high duty cycles. Thus, examples described herein control or regulate the gain of the control loop, which is circuitry that controls the ON-time duration of the buck converter responsive to detected phase differences with a reference clock, as a function of the duty cycle of the buck converter. For example, if regulating the ON-time of the high-side switch, the examples described herein alter the ON-time duration by a smaller amount responsive to the buck converter operating at a relatively low duty cycle, and by a larger amount responsive to the buck converter operating at a relatively high duty cycle. As a result of regulating the gain as a function of duty cycle of the voltage converter, the frequency response of the ON-time control loop is less variable over a wider range of duty cycle ratios.

Examples described herein generate the ON-time (e.g., a high-side period) for the high-side switch using a digital implementation. In the described examples, the digital implementation uses an indication of a duty cycle of the voltage converter to generate the ON-time for the high-side switch as a function of the duty cycle of the voltage converter. Other examples described herein generate the ON-time (e.g., a low-side period) for a low-side switch (e.g., a low-side power transistor on the primary side of the transformer) of the buck converter using the digital implementation, which is sometimes referred to as the OFF-time for the high-side switch. In these examples, the digital implementation again uses the indication of the duty cycle of the voltage converter to generate the ON-time for the low-side switch as a function of the duty cycle of the voltage converter. As described further below, regulating the gain of the digital OTG control loop reduces the variability of the frequency response of the control loop over a wider range of duty cycle ratios.

In some described examples, the switching of a transistor (e.g., the high-side switch, the low-side switch) included in the power converter is synchronized to a reference clock (e.g., an external clock) by varying the ON-time with a digital control circuit. Examples described herein achieve a relatively fast response to phase error by including one or more pulse generators in series. In some described examples, at least one of the pulse generators is controlled asynchronously. For example, the asynchronously controlled pulse generator varies a relatively small portion (e.g., 0 ns to 6 ns in steps of approximately 150 picoseconds (ps)) of the high-side switch ON-time (e.g., up to 1 microsecond (us)) based on the phase error in the beginning of the high-side period (HS period), or the time during which the high-side switch is ON or otherwise in the enabled state. Also, examples described herein facilitate control of the ON-time as a function of duty cycle of the power converter, such that the frequency response of the control loop of the digital OTG is less variable over a wider range of duty cycle ratios, which enables the digital OTG to more finely tune the frequency of the power converter across a wider range of duty cycle ratios. The examples described herein may apply to the low-side switch of the power converter.

FIG. 1 is a schematic diagram of a system 100 in accordance with examples of this description. The system includes an OTG controller 102 that is coupled to a voltage converter 104 comprising a power stage 106. The power stage 106 includes control logic 108 (e.g., a suitable driver) to control the operation of a high-side switch 110 and a low-side switch 112, which may be FETs. The high-side switch 110 couples to an input voltage terminal 114 that receives a voltage VIN. The low-side switch 112 is coupled to the high-side switch 110 and to a ground terminal 116. The voltage converter 104 includes an inductor (L_out) 118 and a capacitor (C_out) 120 to generate or otherwise maintain an output voltage (VOUT) at a terminal 122 (e.g., a programmed output voltage). In FIG. 1, the voltage converter 104 is a buck converter. The OTG controller 102 controls a length of a HS period (e.g., a HS length), or a time during which the high-side switch 110 is ON or otherwise enabled. In another example, the OTG controller 102 controls a length of a LS period (e.g., a LS length), which is a time during which the low-side switch 112 is ON or otherwise enabled.

In FIG. 1, the OTG controller 102 measures and/or otherwise determines a phase difference between a first rising edge of a reference clock signal (Ref_clk_sw) 124 and a second rising edge of a high-side signal (HS_active) 126. The reference clock signal 124 is received from an external clock or a reference clock circuit. The high-side switch 110 switches ON responsive to HS_active 126 being high (e.g., a signal corresponding to a digital 1, a high voltage, etc.). Responsive to the high-side switch 110 being ON, the voltage converter 104 performs a voltage conversion operation.

A loop comparator 128 compares a circuit variable of the voltage converter 104, such as a current through the inductor 118 (e.g., a voltage indicative of the current through the inductor 118) to a threshold value (e.g., a threshold voltage). In this example, in which HS_active 126 being asserted switches ON the high-side switch 110, the threshold value provided to the loop comparator 128 corresponds to an inductor current valley value. The inductor current valley value corresponds to an amount of current through the inductor 118 which, responsive to being reached, indicates the end of the LS period. For example, the voltage indicative of the inductor 118 current is provided to the inverting terminal of the loop comparator 128 and the threshold voltage is provided to the non-inverting terminal of the loop comparator 128. Thus, responsive to the current through the inductor 118 being less than the inductor current valley value, the output of the loop comparator 128 is asserted, which causes the OTG controller 102 to assert HS_active 126 to begin the HS period by turning ON the high-side switch 110.

The OTG controller 102 determines the phase difference between the rising edge of the reference clock signal 124 and the rising edge of HS_active 126. If the phase difference indicates that the rising edge of HS_active 126 is received by the OTG controller 102 before the rising edge of the reference clock signal 124, then the OTG controller 102 determines that the ON-time of the high-side switch 110 was too short (e.g., resulting in the inductor 118 current prematurely reaching the inductor current valley value) and thus lengthens the ON-time by keeping HS_active 126 asserted for an additional amount of time. Conversely, if the phase difference indicates that the rising edge of HS_active 126 is received after the rising edge of the reference clock signal 124, then the OTG controller 102 determines that the ON-time of the high-side switch 110 was too long (e.g., resulting in the inductor 118 current belatedly reaching the inductor current valley value) and thus shortens the ON-time by asserting HS_active 126 for a decreased amount of time.

Figure 2:
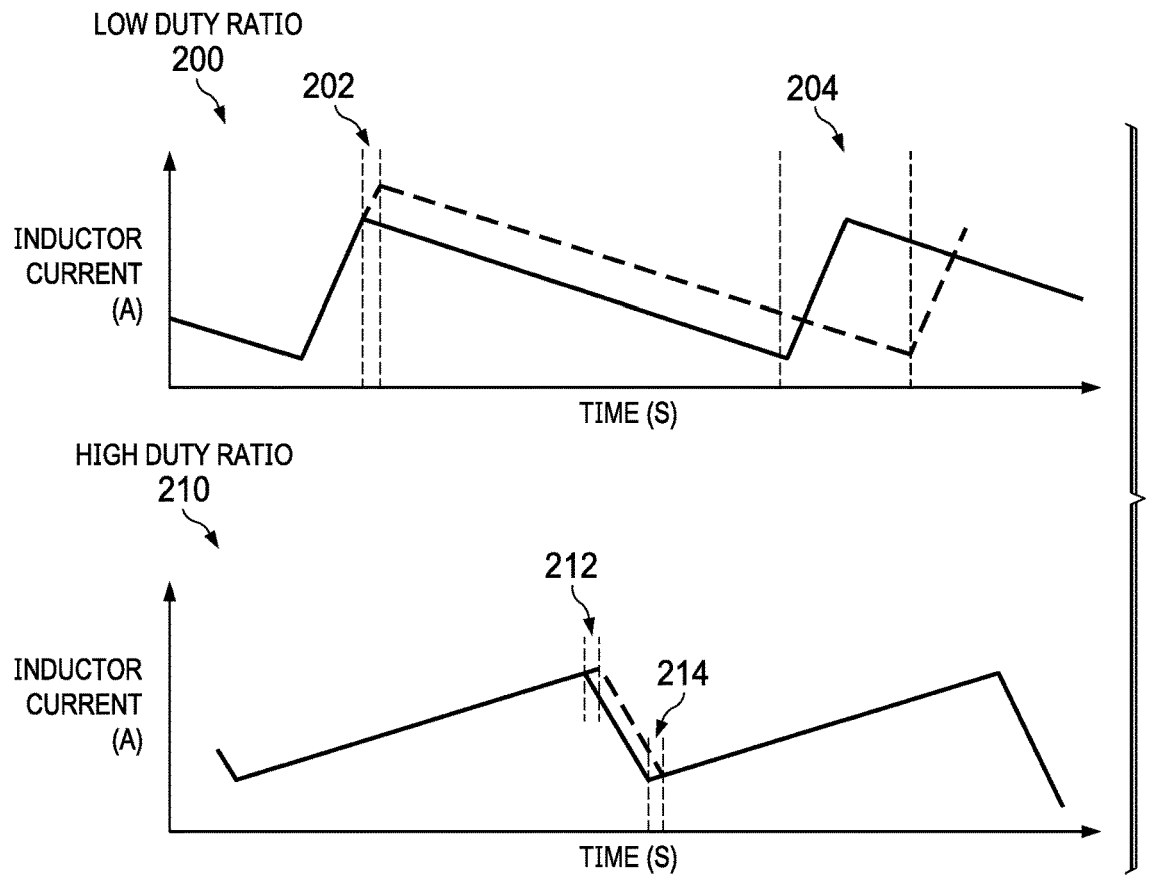
FIG. 2 is a graph of example waveforms of current through an output inductor of a power converter at first and second duty cycles in accordance with various examples.

FIG. 2 includes two waveforms 200, 210 of inductor 118 current as a function of time. A first waveform 200 corresponds to the voltage converter 104 being operated at a relatively low duty cycle. A second waveform 210 corresponds to the voltage converter 104 being operated at a relatively high duty cycle. The waveforms 200, 210 demonstrate the relative impact of a 1 nanosecond (ns) increase in ON-time of the high-side switch 110 on voltage converter 104 frequency at differing duty cycles.

In the first waveform 200, the time period 202 represents a 1 ns increase in ON-time of the high-side switch 110 at a relatively low duty cycle. At the relatively low duty cycle, the slew rate of inductor 118 current is relatively high, which continues through the time period 202. However, irrespective of whether the duration of the HS period includes the time period 202, after the HS period ends, the inductor 118 current decreases at a uniform, relatively low rate due to the relatively low duty cycle.

In the second waveform 210, the time period 212 also represents a 1 ns increase in ON-time of the high-side switch 110, but at a relatively high duty cycle. At the relatively high duty cycle, the slew rate of inductor 118 current is relatively low, which also continues through the time period 202. However, irrespective of whether the duration of the HS period includes the time period 212, after the HS period ends, the inductor 118 current decreases at a uniform, relatively high rate due to the relatively high duty cycle.

As a result, extending the HS period by the time period 202 at a low duty cycle has a disproportionately greater impact on the frequency of the voltage converter 104 than extending the HS period by the time period 212 at a high duty cycle. This disproportionate impact is demonstrated by the time period 204 in the first waveform 200, which represents the difference in times at which the inductor 118 current reaches the current valley value, as compared to the time period 214 in the second waveform 210. Examples in this description address the foregoing by varying the gain of a control loop of the OTG controller 102 as a function of duty cycle of the voltage converter 104. For example, for a given detected phase difference value (e.g., between Ref_clk_sw 124 and HS_active 126), the ON-time of the high-side switch 110 is altered by a smaller amount at relatively low duty cycles than at relatively high duty cycles.

The above description generally relates to the ON-time of the high-side switch 110. However, in some examples, the OTG controller 102 controls the ON-time of the low-side switch 112 (e.g., the OFF-time of the high-side switch 110). In these examples, the loop comparator 128 instead compares the inductor 118 current to a current peak threshold value that, responsive to being reached, causes the OTG controller 102 to trigger the ON-time of the low-side switch 112. In examples where the OTG controller 102 controls the ON-time of the low-side switch 112, the gain of the control loop of the OTG controller 102 is still varied as a function of duty cycle of the voltage converter 104, but in an opposing manner. For example, for a given detected phase difference value (e.g., between the reference clock signal 124 and the rising edge of a signal to begin the ON-time of the low-side switch 112), the ON-time of the low-side switch 112 is altered by a smaller amount at relatively high duty cycles than at relatively low duty cycles.

Figure 3A:
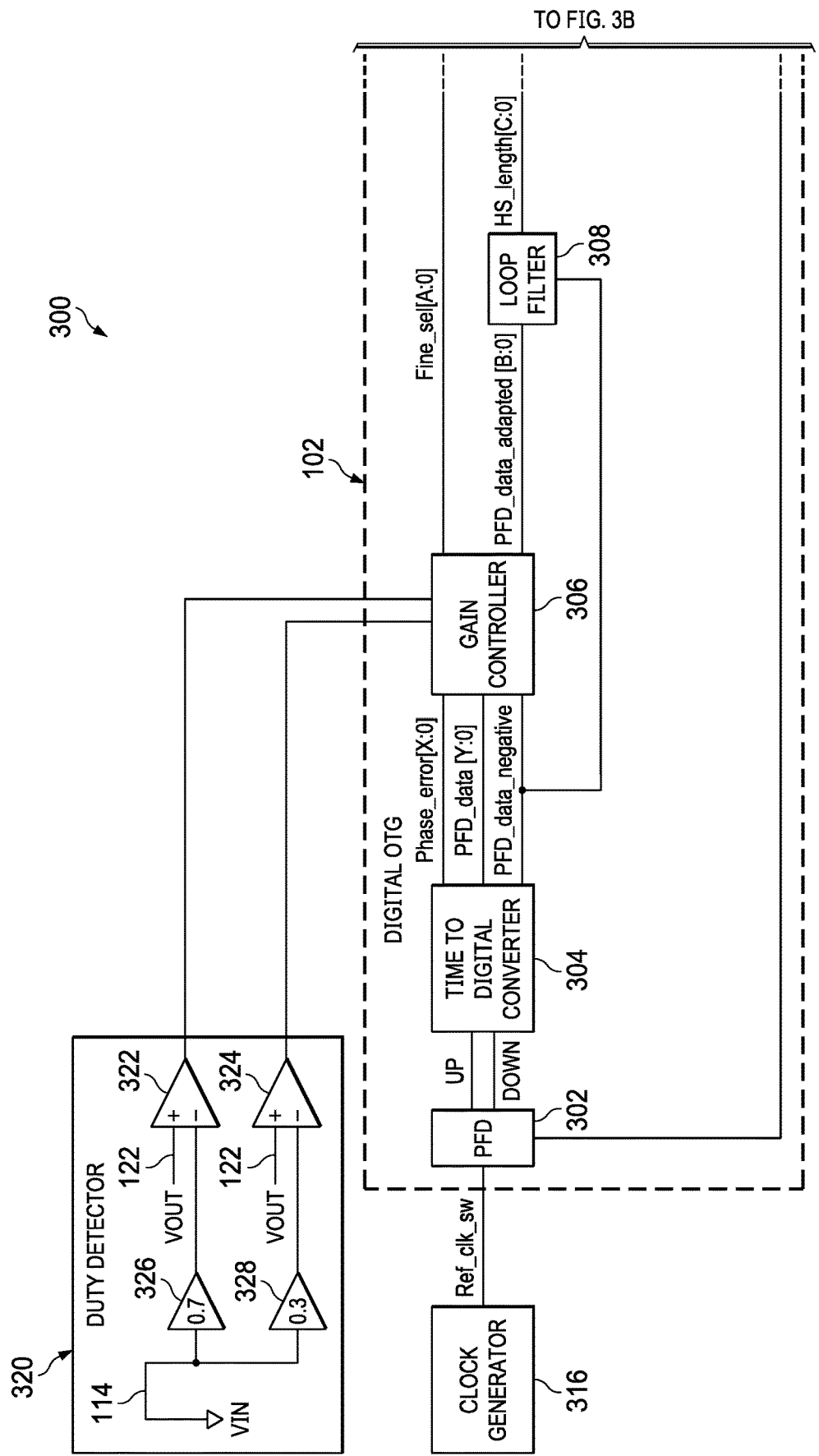
FIGS. 3A and 3B are a schematic diagram of a digital OTG system for a power converter configured to operate at various duty cycles in accordance with various examples.
Figure 3B:
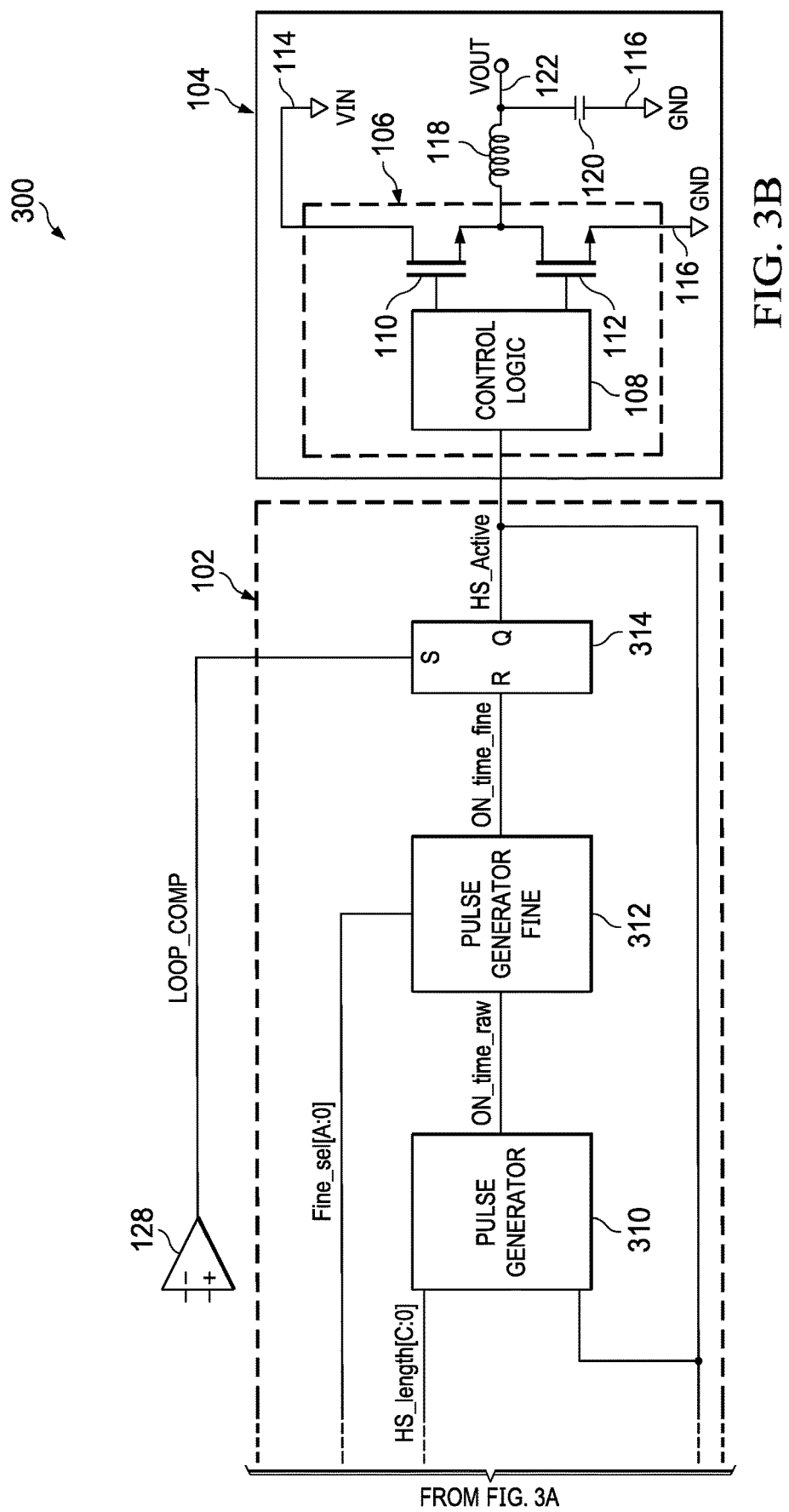

FIGS. 3A and 3B are a schematic diagram of an example system 300 to implement the techniques described herein. The system 300 includes the digital OTG controller 102 shown in further detail. The digital OTG controller 102 is coupled to the voltage converter 104 comprising a power stage 106. The voltage converter 104 includes all of the components described above with respect to FIG. 1. In FIG. 3B, the voltage converter 104 is a buck converter. The digital OTG controller 102 controls a length of a HS period (e.g., a HS length), or a time during which the high-side switch 110 is ON or otherwise enabled. In another example, the digital OTG controller 102 controls a length of a LS period (e.g., a LS length), or a time during which the low-side switch 112 is ON or otherwise enabled.

The digital OTG controller 102 of FIGS. 3A and 3B is an integrated circuit (IC) (e.g., a hardware controller). In some examples, the digital OTG controller 102 includes one or more ICs. In some examples, the digital OTG controller 102 is implemented using hardware logic, machine-readable instructions, hardware-implemented state machines, and/or any combination thereof. The digital OTG controller 102 varies ON-times for the high-side switch 110 as a function of a duty cycle of the voltage converter 104 and, thus, more finely tunes the frequency of the voltage converter 104 across a wider range of duty cycles. As a result, the digital OTG controller 102 achieves more stable operation of the control loop of the voltage converter 104 compared to an OTG controller that does not vary the ON-times for the high-side switch 110 as a function of the duty cycle of the voltage converter 104. The digital OTG controller 102 can start up from pulse frequency modulation (PFM) in a relatively short period (e.g., 4 ns, 6 ns) to respond to load transients. The digital OTG controller 102 of FIGS. 3A and 3B includes an example phase frequency detector (PFD) 302, an example time-to-digital (TTD) converter 304, an example gain controller 306, an example digital loop filter (e.g., a digital infinite impulse response (IIR) filter) 308, a first example pulse generator 310, a second example pulse generator (Pulse Generator Fine) 312, and an example latch 314. An example reference clock source 316 provides a reference clock signal (Ref_clk_sw) as an input to the PFD 302.

In the example of FIG. 3A, the PFD 302 is an IC. In FIG. 3A, the PFD 302 is configured to determine a phase and frequency difference between Ref_clk_sw (received at a first detector input) and an example HS_active signal, which is also provided as an input to the PFD 302 (received at a second detector input). For example, the PFD 302 generates a first example signal (UP) and a second example signal (DOWN), which are provided at a detector output. The UP signal and the DOWN signal correspond to pulse lengths. For example, the PFD 302 generates the UP signal responsive to Ref_clk_sw having a frequency that is greater than a frequency of HS_active (e.g., responsive to a rising edge of Ref_clk_sw being received by the PFD 302 prior to a rising edge of HS_active). The pulse length of the UP signal is proportional to the frequency difference. In other examples, the PFD 302 generates the DOWN signal responsive to Ref_clk_sw having a frequency that is less than the frequency of HS_active (e.g., responsive to a rising edge of Ref_clk_sw being received by the PFD 302 after a rising edge of HS_active). The pulse length of the DOWN signal is proportional to the frequency difference.

In the example of FIG. 3A, the PFD 302 is configured to generate and transmit the UP signal or the DOWN signal (e.g., an indication of the determined phase difference) to the TTD converter 304, specifically to a converter input of the TTD converter 304. In an example, the TTD converter 304 of FIG. 3A is an IC. The TTD converter 304 measures the pulse lengths of the UP signal or the DOWN signal and converts the pulse lengths to one or more example digital indications (e.g., one or more digital values, one or more byte values) of the determined phase difference, which are provided at a converter output of the TTD converter 304. The TTD converter 304 converts and/or otherwise asynchronously translates the pulse lengths (e.g., with corresponding circuitry including delay cells included in the TTD converter 304, not shown for simplicity).

In the example of FIG. 3A, the digital indication(s) of the phase difference generated by the TTD converter 304 include a first example digital indication (Phase_error[X:0]) and a second example digital indication (PFD_data[Y:0]). In some examples, the Phase_error digital indication is one-hot encoded while the PFD_data digital indication is binary encoded; however, this is merely an example of possible encoding types depending on the digital circuitry utilized. Irrespective of the encoding type, the example digital indications are values that correspond to the phase error detected by the PFD 302. In some examples, the TTD converter 304 also generates a sign bit (PFD_data negative) that indicates a sign of the phase difference. For example, responsive to the TTD converter 304 receiving the UP signal, the resultant sign of the phase difference is negative; conversely, responsive to the TTD converter 304 receiving the DOWN signal, the resultant sign of the phase difference is positive. As described further below, PFD_data negative being asserted or set indicates that the switching frequency of the voltage converter 104 is less than that of Ref_clk_sw and thus the ON-time of the high-side switch 110 should be decreased.

In FIG. 3A, the digital OTG controller 102 also includes a gain controller 306 in accordance with various examples. The gain controller 306 is configured to receive an indication (e.g., one or more digital indications) of the phase difference at a controller input of the gain controller 306. In the example of FIG. 3A, the gain controller 306 receives both the Phase_error digital indication and the PFD_data digital indication from the TTD converter 304. However, in other examples, the gain controller 306 receives a single digital indication of the phase difference. The gain controller 306 is also configured to receive an indication of a duty cycle of the voltage converter 104, which is described further below.

In the example of FIG. 3A, the gain controller 306 is configured to generate a first digital value (PFD_data adapted[B:0]) based at least on the digital indication(s) of the phase difference. In other examples, the gain controller 306 is also configured to generate PFD_data adapted based on the duty cycle of the voltage converter 104. The gain controller 306 is also configured to generate a second digital value (Fine_sel[A:0]) based on the digital indication(s) of the phase difference and the duty cycle of the voltage converter 104. The digital values are provided at a controller output of the gain controller 306. As described further below, generating the second digital value based on both the phase difference of Ref_clk_sw and HS_active and the duty cycle of the voltage converter 104 allows the digital OTG controller 102 to vary its control loop gain (e.g., the gain from the phase difference determined by the PFD 302 to the corresponding increase or decrease of the HS period duration) based on the duty cycle of the voltage converter 104. Varying the control loop gain based on the duty cycle of the voltage converter 104 addresses the problems described above with respect to FIG. 2 relating to the impact of ON-time changes on the frequency of the voltage converter 104 across a range of duty cycles. The first digital value (PFD_data adapted) is provided to the loop filter 308 to generate an example HS length (HS_length[C:0]). The first pulse generator 310 receives HS_active (e.g., received at an input of the first pulse generator 310) and is configured to, responsive to HS_active being asserted, assert a first generator signal (ON_time_raw) (e.g., at a generator output of the first pulse generator 310) after a first time delay that is specified by the value of the HS_length signal (e.g., received at an input of the first pulse generator 310). The second digital value (Fine_sel) is provided to the second pulse generator 312 to control a small portion or a fine tuning portion of the ON-time at the end of the corresponding HS period. For example, responsive to ON_time_raw being asserted (e.g., received at an input of the second pulse generator 312), the second pulse generator 312 is configured to assert a second generator signal (ON_time_fine) (e.g., at a generator output of the second pulse generator 312) after a second time delay that is specified by the value of the Fine_sel signal (e.g., received at an input of the second pulse generator 312).

As described above, the gain controller 306 receives an indication of the duty cycle of the voltage converter 104. A duty cycle detector 320 generates this indication of the duty cycle of the voltage converter 104 (e.g., at a duty cycle output of the duty cycle detector 320) and provides the indication to the gain controller 306 (e.g., to a second controller input of the gain controller 306). In examples, the duty cycle detector 320 includes a duty cycle input that provides input values to a first comparator 322 and a second comparator 324 of the duty cycle detector 320.

The first comparator 322 has a non-inverting input that is coupled to the terminal 122 and thus is configured to receive an output voltage VOUT of the voltage converter 104. The first comparator 322 also has an inverting input that couples to a voltage divider 326, which generates a first fraction of an input voltage VIN (e.g., provided at the input voltage terminal 114) of the voltage converter 104. In examples, the voltage divider 326 produces a voltage equal to approximately 0.7*VIN. As a result, the output of the first comparator 322 is asserted responsive to VOUT being greater than 0.7*VIN, which corresponds to a relatively high duty cycle.

The second comparator 324 has a non-inverting input that couples to the terminal 122 and that is configured to receive VOUT. The second comparator 324 also has an inverting input that couples to a voltage divider 328, which generates a second fraction of VIN. In examples, the voltage divider 328 produces a voltage equal to approximately 0.3*VIN. As a result, the output of the second comparator 324 is de-asserted responsive to VOUT being less than 0.3*VIN, which corresponds to a relatively low duty cycle.

In examples, if the duty cycle is less than 0.3, then both the output of the first comparator 322 and the output of the second comparator 324 are de-asserted. If the duty cycle is between 0.3 and 0.7, then the output of the first comparator 322 is de-asserted and the output of the second comparator 324 is asserted. Finally, if the duty cycle is greater than 0.7, then both the output of the first comparator 322 and the output of the second comparator 324 are asserted. Thus, the duty cycle detector 320 is configured to indicate whether the duty cycle of the voltage converter 104 is in a first range (e.g., duty cycle <0.3), a second range (e.g., 0.3<duty cycle <0.7), or a third range (e.g., duty cycle >0.7).

In examples, not depicted for brevity, the duty cycle detector 320 includes a single comparator that compares VOUT to a fraction of VIN (e.g., 0.5*VIN). In this example, if the duty cycle is less than 0.5, then the output of the comparator is de-asserted. Thus, the duty cycle detector 320 is configured to indicate whether the duty cycle of the voltage converter 104 is above or below a threshold (e.g., 0.5). In other examples, the duty cycle detector 320 includes additional comparators that allow for a greater number of duty cycle ranges to be detected and represented (e.g., transmitted) to the gain controller 306.

In the example of FIG. 3A, the first digital value (PFD_data adapted[B:0]) generated by the gain controller 306 is received by the loop filter 308, such as at a filter input of the loop filter 308. In this example, the loop filter 308 generally functions as an accumulator and generates an accumulated value (HS_length[C:0]) at a filter output of the loop filter 308 based on PFD_data adapted from the gain controller 306. The loop filter 308 filters PFD_data adapted and outputs a corresponding HS_length to the first pulse generator 310. For example, the loop filter 308 is configured to add PFD_data adapted to (or subtract from, depending on the value of PFD_data negative) a prior HS_length value to generate a new HS_length value. In this example, HS_length corresponds to a digital value that represents a quantity of time to switch ON the high-side switch 110. In other examples, HS_length corresponds to a digital value that represents a quantity of time to switch ON the low-side switch 112.

In the example of FIG. 3B, the first pulse generator 310 receives HS_active and is configured to, responsive to HS_active being asserted, assert a first generator signal (ON_time_raw) after a first time delay that is specified by the value of the HS_length signal. For example, increasing the value of HS_length results in an increased first time delay implemented by the first pulse generator 310. Similarly, decreasing the value of HS_length results in a decreased first time delay implemented by the first pulse generator 310. The first generator signal corresponds to a delay of a reset of the latch 314 as described further below. By delaying the reset of the latch 314, the first pulse generator 310 and, more generally, the digital OTG controller 102 delays the transition of the voltage converter 104 from the HS period to the LS period. The latch 314 of FIG. 3B is a level sensitive latch. Alternatively, other types of flip-flops or latches may be substituted for the latch 314 of FIG. 3B.

In FIG. 3B, the first pulse generator 310 transforms or otherwise converts HS_length from the loop filter 308 to the first generator signal (ON_time_raw) at the beginning of a HS period. ON_time_raw corresponds to a first time component, or a first pulse length, of HS_active. For example, ON_time_raw corresponds to a quantity of a time delay (e.g., a pulse delay), during which the high-side switch 110 is ON. In other examples, ON_time_raw corresponds to a quantity of the time delay (e.g., the pulse delay), during which the low-side switch 112 is ON. In FIG. 3B, the first pulse generator 310 is triggered with a rising edge of HS_active.

The second pulse generator 312 receives the second digital value (Fine_sel) from the gain controller 306. Responsive to ON_time_raw being asserted, the second pulse generator 312 is configured to assert a second generator signal (ON_time_fine) after a second time delay that is specified by the value of the Fine_sel signal. For example, increasing the value of Fine_sel results in an increased second time delay implemented by the second pulse generator 312. Similarly, decreasing the value of Fine_sel results in a decreased second time delay implemented by the second pulse generator 312. The second generator signal corresponds to a delay of a reset of the latch 314 as described further below.

In FIG. 3B, the second pulse generator 312 varies a relatively small portion of the ON-time at the end of the HS period. In one example, a one-bit change in value to Fine_sel corresponds to a 150 ps change in the ON-time (e.g., delay implemented by the second pulse generator 312). Responsive to the gain controller 306 converting an indication of phase difference to the first and second digital values (PFD_data adapted and Fine_sel) based on the duty cycle of the voltage converter 104, the second pulse generator 312 determines an amount of delay to add to the first generator signal, ON_time_raw. For example, the second pulse generator 312 determines the amount of delay while the TTD converter 304, the gain controller 306, the loop filter 308, and the first pulse generator 310 function. The second pulse generator 312 adds the amount of delay to ON_time_raw to generate the second generator signal (ON_time_fine).

In FIG. 3B, the second pulse generator 312 transmits ON_time_fine to the latch 314 to reset the latch 314 and, thus, end the HS period. For example, the second pulse generator 312 resets the latch 314 responsive to a rising edge of ON_time_fine. Responsive to resetting the latch 314, an example loop comparator 128 generates an example loop comparator signal (Loop_comp) to set the latch 314 and trigger the HS period via HS_active. The loop comparator 128 compares a circuit variable of the voltage converter 104, such as a current through the inductor 118 (e.g., a voltage indicative of the current through the inductor 118) to a threshold value. In this example, in which HS_active being asserted switches ON the high-side switch 110, the threshold value corresponds to an inductor current valley value. Thus, responsive to the current through the inductor 118 being less than the current valley value, the output of the loop comparator 128 is asserted, which sets the latch 314. Responsive to the latch 314 being set, the high-side switch 110 is switched ON for a time corresponding to the length of the first generator signal (ON_time_raw) and the second generator signal (ON_time_fine). In other examples, responsive to the latch 314 being set, the low-side switch 112 is switched ON for the time corresponding to the length of the first generator signal (ON_time_raw) and the second generator signal (ON_time_fine). Generally, the first pulse generator 310 generates its delay via synchronous control responsive to HS_active being asserted, while the second pulse generator 312 generates its delay via asynchronous control responsive to the ON_time_raw signal being asserted.

In accordance with examples of this description, the gain controller 306 is configured to vary the values of Fine_sel and/or PFD_data adapted based on the duty cycle of the voltage converter 104 (e.g., indicated by the duty cycle detector 320). For example, for a given phase difference value (e.g., detected by the PFD 302 and digitized by the TTD converter 304), the gain controller 306 is configured to generate values of Fine_sel and/or PFD_data adapted that vary based on the duty cycle of the voltage converter 104. In the example of FIGS. 3A and 3B, the digital OTG controller 102 controls the ON-time of the high-side switch 110 and the duty cycle detector 320 indicates whether the duty cycle of the voltage converter 104 is in a first range (e.g., duty cycle <0.3), a second range (e.g., 0.3<duty cycle <0.7), or a third range (e.g., duty cycle >0.7).

For a particular detected phase difference value, responsive to the duty cycle being in the first range, the gain controller 306 generates PFD_data adapted having a first value and Fine_sel having a fourth value. For the particular detected phase difference value, responsive to the duty cycle being in the second range, the gain controller 306 generates PFD_data adapted having a second value and Fine_sel having a fifth value. For the particular detected phase difference value, responsive to the duty cycle being in the third range, the gain controller 306 generates PFD_data adapted having a third value and Fine_sel having a sixth value. In this example, where the digital OTG controller 102 controls the ON-time of the high-side switch 110, the values of PFD_data adapted and/or Fine_sel increase as a function of duty cycle (e.g., C >B>A, F >E >D). In an example in which the digital OTG controller 102 controls the ON-time of the low-side switch 112, the values of PFD_data adapted and/or Fine_sel decrease as a function of duty cycle (e.g., A >B>C, D>E >F).

In various examples, the amount by which the gain controller 306 changes the values of PFD_data adapted and/or Fine_sel for a particular phase difference is implementation-specific. For example, the gain controller 306 is configured to apply various coefficients to the digital indication(s) of the phase difference depending on the detected duty cycle to produce the PFD_data adapted and/or Fine_sel values. In an example, a detected phase difference of 3 ns while the voltage converter 104 has a duty cycle in the first range results in a change (e.g., increase or decrease depending on the sign of the phase difference) to the Fine_sel value that causes the second pulse generator 312 to change its delay by 150 ps. Continuing this example, a detected phase difference of 1 ns while the voltage converter 104 has a duty cycle in the second range results in a change to the Fine_sel value that causes the second pulse generator 312 to change its delay by 150 ps. Still continuing this example, a detected phase difference of 500 ps while the voltage converter 104 has a duty cycle in the third range results in a change to the Fine_sel value that causes the second pulse generator 312 to change its delay by 150 ps. In this way, the gain of the control loop of the digital OTG controller 102 is varied as a function of duty cycle because the change to the delay introduced by the second pulse generator 312 is less sensitive to a detected phase difference at low duty cycles and more sensitive to a detected phase difference at high duty cycles. In various examples, the gain controller 306 is similarly configured to vary the value of PFD_data adapted as a function of duty cycle of the voltage converter 104 as well.

Figure 4:
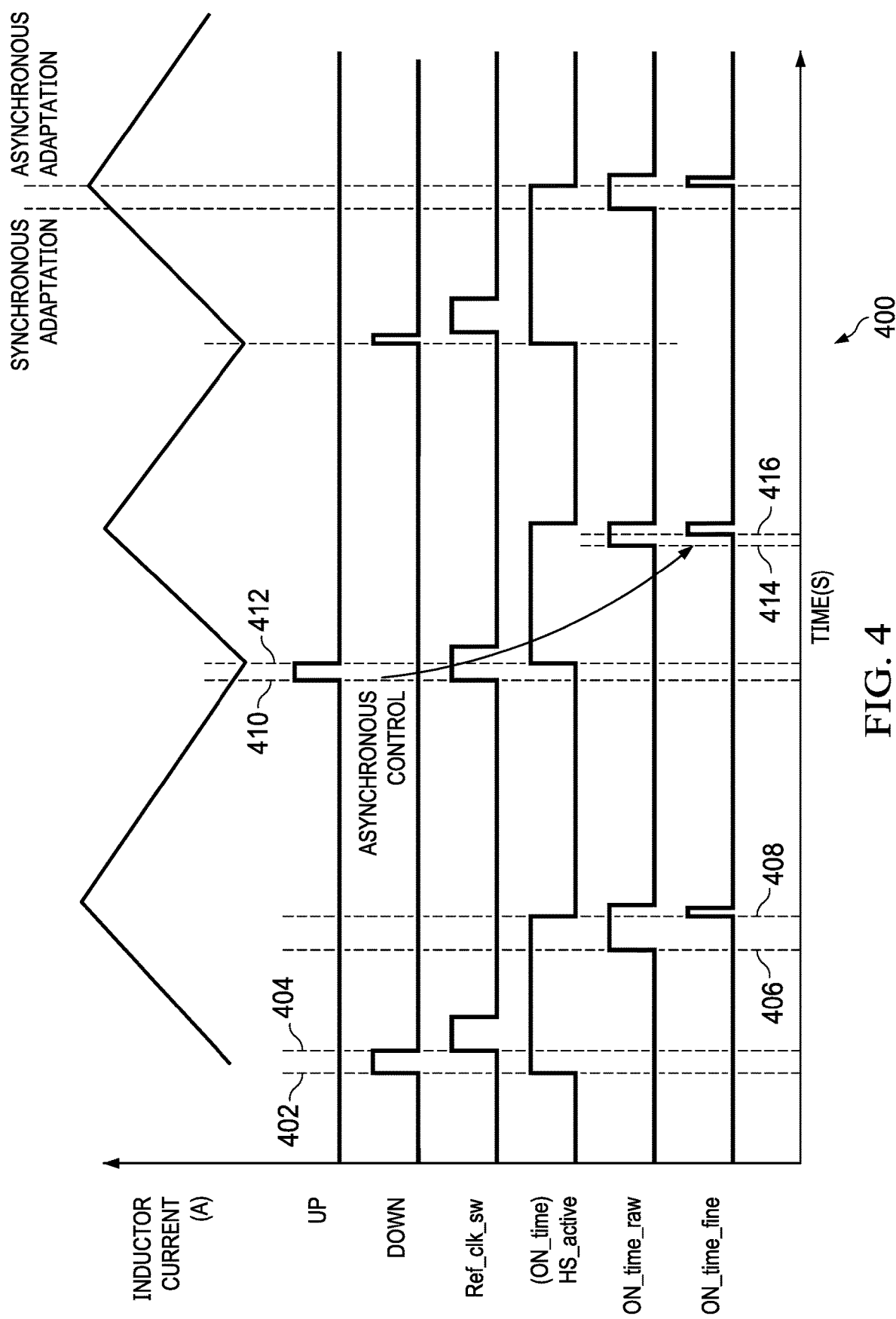
FIG. 4 is a timing diagram corresponding to operation of the example digital OTG system of FIGS. 3A and 3B in accordance with various examples.

FIG. 4 is a timing diagram 400 corresponding to operation of the system 300 of FIGS. 3A and 3B as a function of time, according to the examples described herein. The timing diagram 400 includes an example waveform for inductor current, which corresponds to the current flowing through the inductor 118. The timing diagram 400 also includes UP and DOWN waveforms corresponding to the UP and DOWN signals generated by the PFD 302. The Ref_clk_sw waveform corresponds to the signal generated by the reference clock source 316, while the HS_active waveform corresponds to the output of the latch 314. The ON_time_raw waveform corresponds to the output of the first pulse generator 310 and the ON_time_fine waveform corresponds to the output of the second pulse generator 312.

At time 402, HS_active is asserted prior to Ref_clk_sw and, as a result, the PFD 302 asserts the DOWN signal to indicate that the voltage converter 104 frequency is higher than the reference clock source 316 frequency. At time 404, Ref_clk_sw is asserted, and thus the PFD 302 de-asserts the DOWN signal. As described above, the TTD converter 304 receives and converts the DOWN signal to a digital indication of the pulse width of the DOWN signal. The gain controller 306 receives the digital indication and generates the PFD_data adapted and Fine_sel signals based on the phase difference indicated by the DOWN signal and the duty cycle of the voltage converter 104 indicated by the duty cycle detector 320.

The loop filter 308 receives and processes (e.g., applies a coefficient and/or adds to an accumulated value) the PFD_data adapted signal to generate the HS_length signal. The first pulse generator 310 receives the HS_length signal and HS_active and generates a pulse at time 406 (ON_time_raw) that is delayed from the rising edge of HS_active by an amount of time indicated by the HS_length signal value. In the example of FIG. 4, the amount of synchronous delay imposed by the first pulse generator 310 is the duration from the time 402 to the time 406. The second pulse generator 312 receives the Fine_sel signal and the ON_time_raw signal and generates a pulse at time 408 (ON_time_fine) that is delayed from the rising edge of the ON_time_raw signal by an amount of time indicated by the Fine_sel signal value. In the example of FIG. 4, the amount of asynchronously controlled delay imposed by the second pulse generator 312 is the duration from the time 406 to the time 408. Responsive to the assertion of ON_time_fine, the latch 314 is reset and thus HS_active is de-asserted, which ends the ON-time of the high-side switch 110 of the voltage converter 104.

At time 410, the reference clock source 316 asserts Ref_clk_sw, while the inductor 118 current has not yet reached its lower threshold, or current valley value. As a result, the PFD 302 asserts the UP signal to indicate that the voltage converter 104 frequency is lower than the reference clock source 316 frequency. At time 412, HS_active is asserted responsive to the inductor 118 current reaching the current valley value, and thus the PFD 302 de-asserts the UP signal. As described above, the TTD converter 304 receives and converts the UP signal to a digital indication of the pulse width of the UP signal. The gain controller 306 receives the digital indication and generates the PFD_data adapted and Fine_sel signals based on the phase difference indicated by the UP signal and the duty cycle of the voltage converter 104 indicated by the duty cycle detector 320.

As above, the loop filter 308 receives and processes (e.g., applies a coefficient and/or subtracts from an accumulated value) the PFD_data adapted signal to generate the HS_length signal. The first pulse generator 310 receives the HS_length signal and HS_active and generates a pulse at time 414 (ON_time_raw) that is delayed from the rising edge of HS_active by an amount of time indicated by the HS_length signal value. In the example of FIG. 4, the amount of synchronous delay imposed by the first pulse generator 310 is the duration from the time 412 to the time 414. The second pulse generator 312 receives the Fine_sel signal and the ON_time_raw signal and generates a pulse at time 416 (ON_time_fine) that is delayed from the rising edge of the ON_time_raw signal by an amount of time indicated by the Fine_sel signal value. In the example of FIG. 4, the amount of asynchronously controlled delay imposed by the second pulse generator 312 is the duration from the time 414 to the time 416. Responsive to the assertion of ON_time_fine, the latch 314 is reset and thus HS_active is de-asserted, which ends the ON-time of the high-side switch 110 of the voltage converter 104.

Figure 5A:
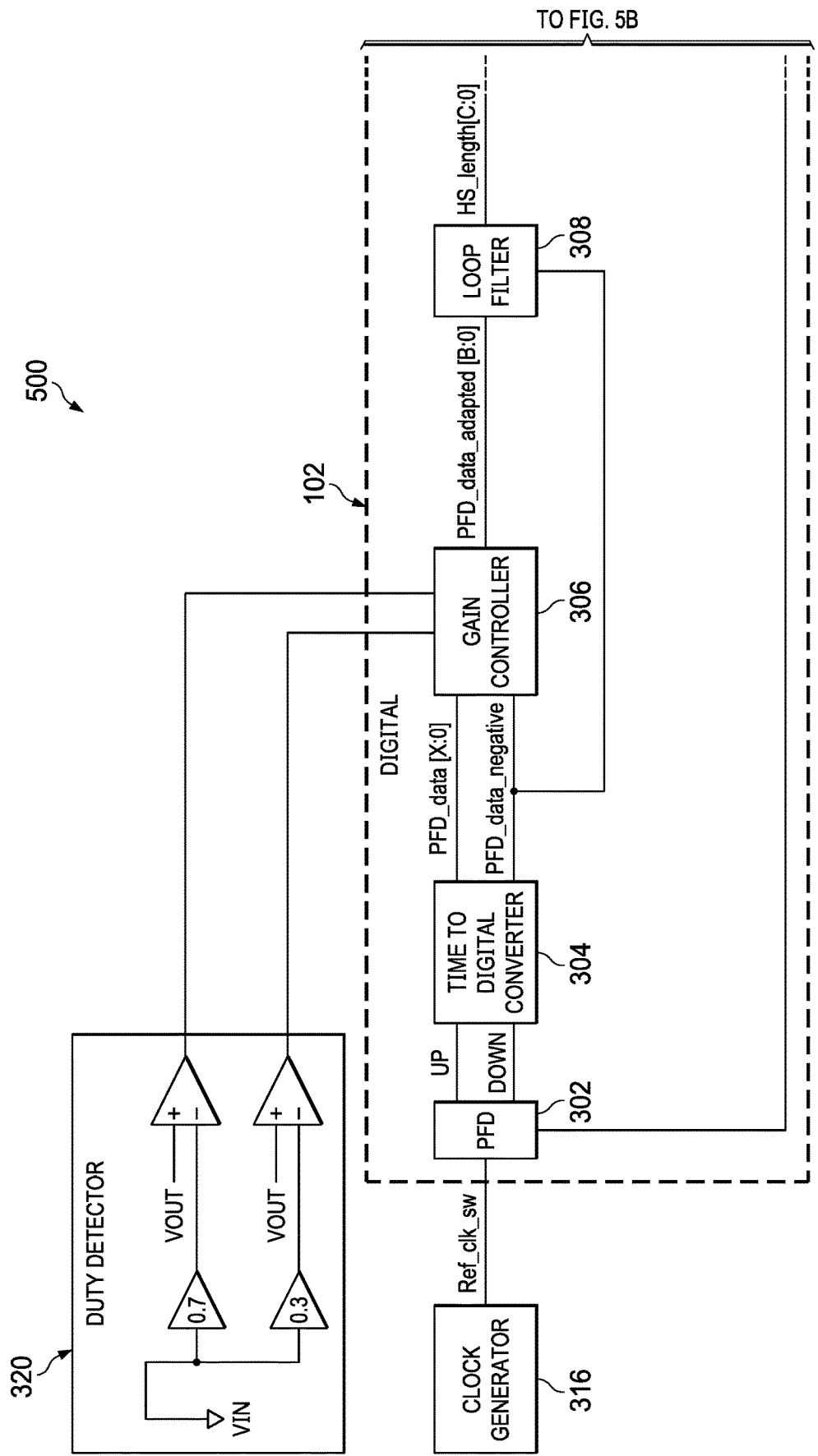
FIGS. 5A and 5B are another example schematic diagram of a digital OTG system for a power converter configured to operate at various duty cycles in accordance with various examples.
Figure 5B:
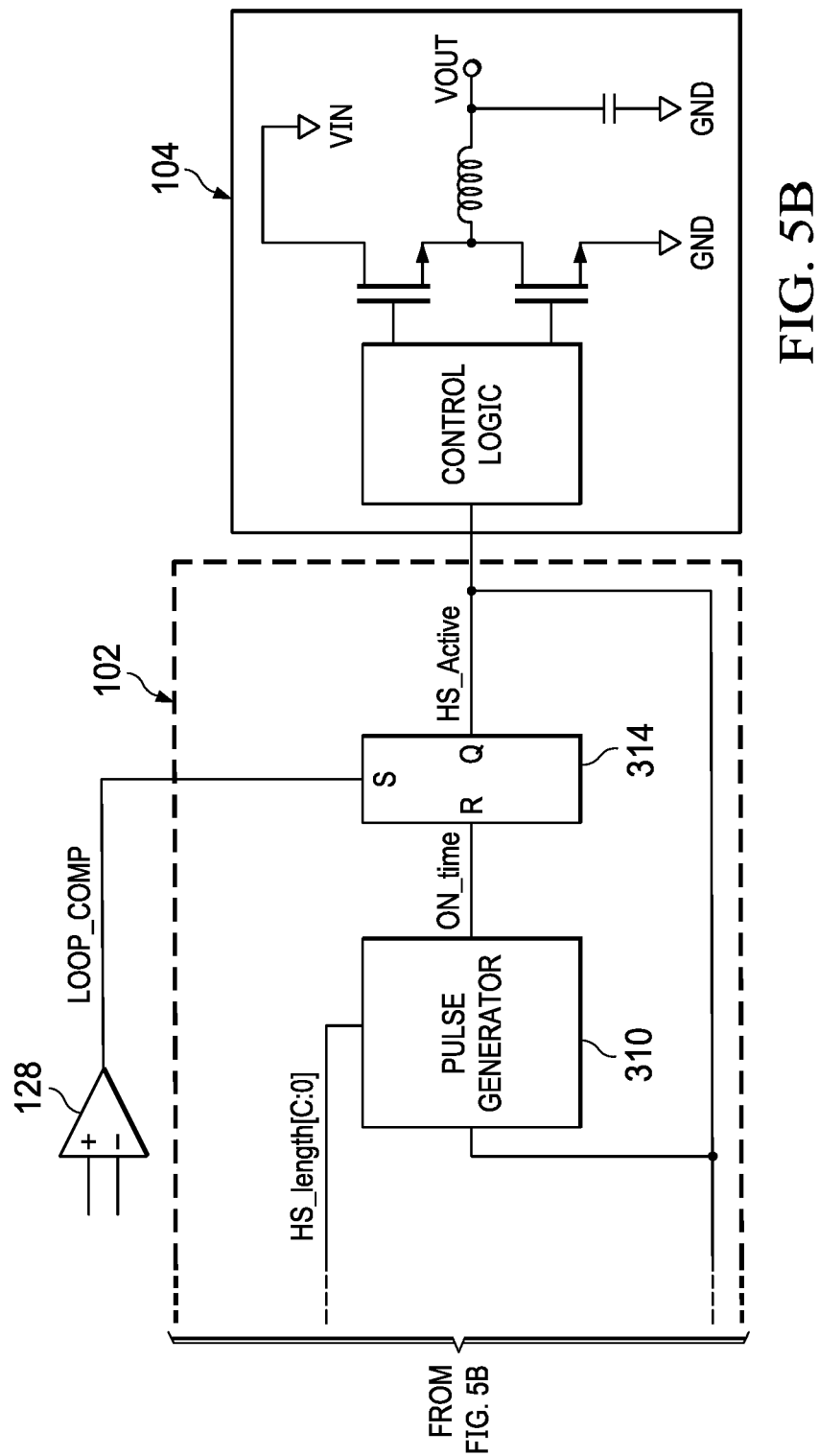
Figure 6A:
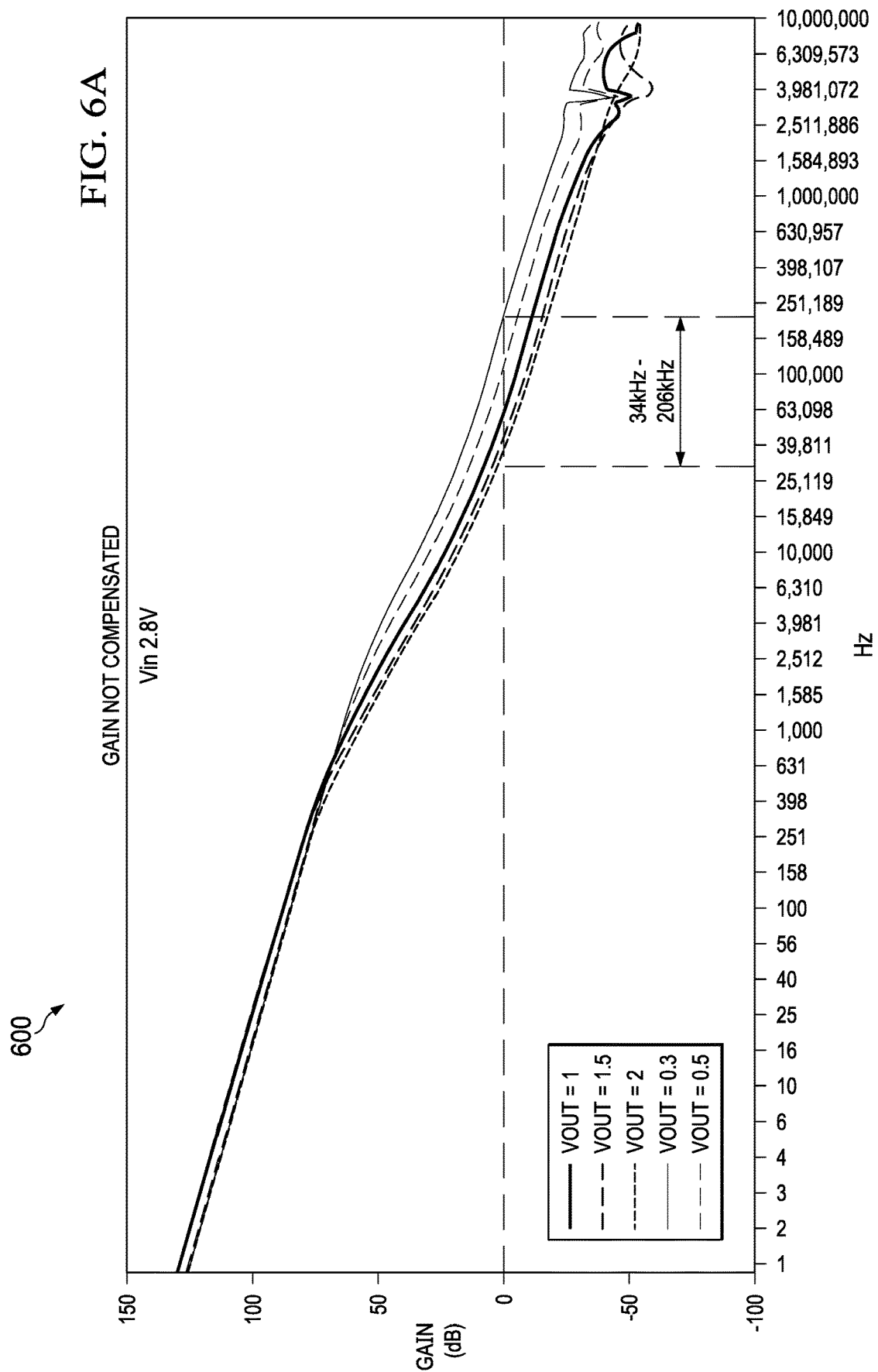

FIGS. 5A and 5B are another schematic diagram of a system 500 to implement the techniques described herein. The system 500 is similar to the system 300, described above with respect to FIGS. 3A and 3B, but includes one pulse generator 310 rather than the first and second pulse generators 310, 312. The system 500 includes the digital OTG controller 102 shown in further detail. The digital OTG controller 102 is coupled to the voltage converter 104 as described above. The digital OTG controller 102 controls the ON-time of one of the switches of the voltage converter 104 as a function of a duty cycle of the voltage converter 104, and, thus, more finely tunes the frequency of the voltage converter 104 across a wider range of duty cycles. As a result, the digital OTG controller 102 achieves more stable operation of the control loop of the voltage converter 104 compared to an OTG controller that does not vary the ON-times for the high-side switch 110 or low-side switch 112 as a function of the duty cycle of the voltage converter 104.

The digital OTG controller 102 includes the PFD 302, the TTD converter 304, the gain controller 306, the loop filter 308, the pulse generator 310, and the latch 314, the functions of which are described above with respect to FIGS. 3A and 3B. As above, the reference clock source 316 provides a reference clock signal (Ref_clk_sw) as an input to the PFD 302. Further, the duty cycle detector 320 provides an indication of the duty cycle of the voltage converter 104 to the digital OTG controller 102 as described above. The loop comparator 128 generates a loop comparator signal (Loop_comp) to set the latch 314 and trigger the HS period of the voltage converter 104 (e.g., by assertion of HS_active). In FIG. 5A, the gain controller 306 generates a digital value (PFD_data adapted) based on the digital indication(s) of the phase difference (e.g., PFD_data[X:0], PFD_data negative) from the TTD converter 304. The digital value PFD_data_adapted is provided to the loop filter 308 that in turn generates an accumulated value (HS_length) to control the delay of the pulse generator 310. The gain controller 306 does not necessarily generate additional digital values because the example of FIGS. 5A and 5B includes one pulse generator 310.

The gain controller 306 is configured to receive an indication of the phase difference. The gain controller 306 is also configured to receive an indication of a duty cycle of the voltage converter 104 from the duty cycle detector 320.

In the example of FIGS. 5A and 5B, the gain controller 306 is configured to generate a digital value (PFD_data adapted[B:0]) based on the digital indication(s) of the phase difference and the duty cycle. Generating PFD_data_adapted based on both the phase difference of Ref_clk_sw and HS_active and the duty cycle of the voltage converter 104 allows the digital OTG controller 102 to vary its control loop gain (e.g., the gain from the phase difference determined by the PFD 302 to the corresponding increase or decrease of the HS period duration) based on the duty cycle of the voltage converter 104. Varying the control loop gain based on the duty cycle of the voltage converter 104 addresses the problems described above with respect to FIG. 2 relating to the impact of ON-time changes on the frequency of the voltage converter 104 across a range of duty cycles. The digital value (PFD_data_adapted) is transmitted to the loop filter 308 to generate an example HS_length (HS_length[C:0]), which is used by the pulse generator 310.

In the example of FIGS. 5A and 5B, the pulse generator 310 receives HS_active and is configured to, responsive to HS_active being asserted, assert a generator signal (ON time) after a time delay that is specified by the value of the HS_length signal. For example, increasing the value of HS_length results in an increased time delay implemented by the pulse generator 310. Similarly, decreasing the value of HS_length results in a decreased time delay implemented by the pulse generator 310. The generator signal corresponds to a delay of a reset of the latch 314. By delaying the reset of the latch 314, the pulse generator 310 and, more generally, the digital OTG controller 102 delays the transition of the voltage converter 104 from the HS period to the LS period. The latch 314 of FIG. 5B is a level sensitive latch. Alternatively, other types of flip-flops or latches may be substituted for the latch 314 of FIG. 5B.

In accordance with examples of this description, the gain controller 306 is configured to vary the value of PFD_data_adapted based on the duty cycle of the voltage converter 104 (e.g., indicated by the duty cycle detector 320). For example, for a given phase difference value (e.g., detected by the PFD 302 and digitized by the TTD converter 304), the gain controller 306 is configured to generate values of PFD_data_adapted that vary based on the duty cycle of the voltage converter 104. In the example of FIGS. 5A and 5B, the digital OTG controller 102 controls the ON-time of the high-side switch 110 and the duty cycle detector 320 indicates whether the duty cycle of the voltage converter 104 is in a first range (e.g., duty cycle <0.3), a second range (e.g., 0.3<duty cycle <0.7), or a third range (e.g., duty cycle >0.7).

For a particular detected phase difference value, if the duty cycle is in the first range, the gain controller 306 is configured to generate PFD_data_adapted having a first value. For the particular detected phase difference value, if the duty cycle is in the second range, the gain controller 306 is configured to generate PFD_data_adapted having a second value. For the particular detected phase difference value, if the duty cycle is in the third range, the gain controller 306 is configured to generate PFD_data_adapted having a third value. In this example, where the digital OTG controller 102 controls the ON-time of the high-side switch 110, the values of PFD_data_adapted increase as a function of duty cycle (e.g., third value >second value >first value). In an example, in which the digital OTG controller 102 controls the ON-time of the low-side switch 112, the values of PFD_data_adapted decrease as a function of duty cycle (e.g., first value >second value >third value).

In various examples, the amount by which the gain controller 306 changes the values of PFD_data_adapted for a particular phase difference is implementation-specific. For example, the gain controller 306 is configured to apply various coefficients to the digital indication(s) of the phase difference depending on the detected duty cycle to produce the PFD_data_adapted values. In this way, the gain of the control loop of the digital OTG controller 102 is varied as a function of duty cycle because the change to the delay introduced by the pulse generator 310 is less sensitive to a detected phase difference at low duty cycles and more sensitive to a detected phase difference at high duty cycles.

FIGS. 6A-6D are various waveforms 600, 610, 620, 630, respectively, that correspond to an alternating current (AC) analysis of the digital OTG controller 102, described above. The waveforms 600, 620 result from an AC analysis in which control loop gain variance as a function of duty cycle of the voltage converter 104 is not employed. The waveforms 610, 630 demonstrate the reduction in frequency response variation that results from the digital OTG control loop gain variation, described above, in accordance with various examples. In the waveforms 600, 610, 620, 630, the y-axis represents the closed loop gain in decibels (dB) of the digital OTG controller 102 and the x-axis represents the frequency of the injected AC voltage in hertz (Hz). Waveform 600 is an example of the frequency response of a digital OTG closed loop gain (e.g., the control loop of the digital OTG controller 102, described above), in which control loop gain is not compensated as a function of duty cycle, at various output voltages (e.g., duty cycles) for an input voltage of 2.8 V. In the waveform 600, the unity gain frequency (e.g., 0 dB gain) differs from 34 kHz-206 kHz across the range of duty cycles. Waveform 610 is an example of the frequency response of the digital OTG closed loop, in which the closed loop gain is compensated as a function of duty cycle (e.g., in which the digital OTG controller 102 is utilized), at various duty cycles for the input voltage of 2.8 V. In the waveform 610, the unity gain frequency differs from 44 kHz-79 kHz across the range of duty cycles, which is a reduced frequency response variation relative to the waveform 600.

Waveform 620 is an example of the frequency response of the digital OTG closed loop gain, in which control loop gain is not compensated as a function of duty cycle, at various duty cycles for an input voltage of 5.5 V. In the waveform 620, the unity gain frequency differs from 40 kHz-492 kHz across the range of duty cycles. Waveform 630 is an example of the frequency response of the digital OTG closed loop, in which the closed loop gain is compensated as a function of duty cycle (e.g., in which the digital OTG controller 102 is utilized), at various duty cycles for the input voltage of 5.5 V. In the waveform 630, the unity gain frequency differs from 34 kHz-117 kHz across the range of duty cycles, which is a reduced frequency response relative to the waveform 620.

Figure 7:
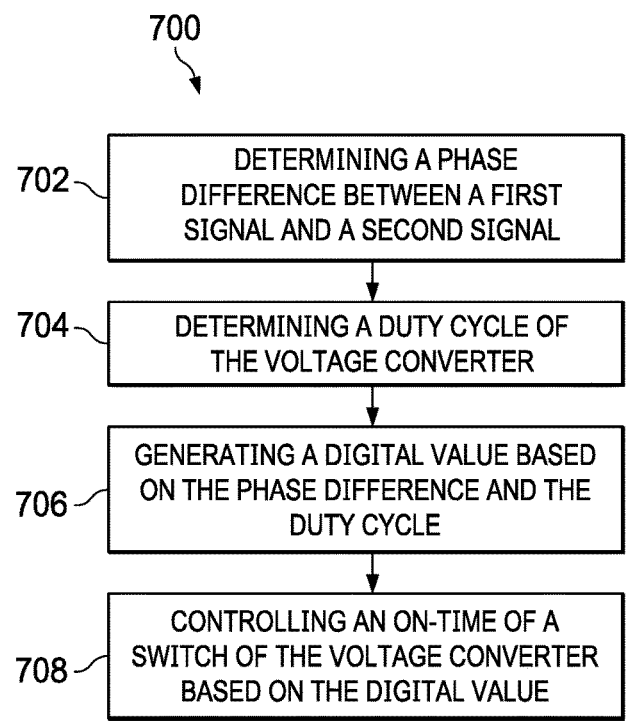
FIG. 7 is a flow chart of a method of controlling a voltage converter in accordance with various examples.

FIG. 7 is a flow chart of a method 700 for controlling a voltage converter (e.g., voltage converter 104) in accordance with examples of this description. The method 700 begins in block 702 with determining a phase difference between a first signal and a second signal. For example, the first signal corresponds to Ref_clk_sw generated by the reference clock source 316 and the second signal corresponds to HS_active generated by the latch 314. HS_active being asserted triggers the beginning of a HS period of the voltage converter 104. In an example, the second signal corresponds to a low-side active signal generated by the latch 314, which triggers the beginning of a low-side period of the voltage converter 104. The phase difference is determined by, for example, the PFD 302.

The method 700 continues in block 704 with determining a duty cycle of the voltage converter 104. For example, the duty cycle detector 320 receives the input and output voltages of the voltage converter 104 and compares the output voltage to one or more thresholds to determine whether the duty cycle is above or below a threshold (e.g., 0.5) or in one of a number of ranges (e.g., duty cycle <0.3; 0.3<duty cycle <0.7; or duty cycle >0.7). The method 700 continues in block 706 with generating a digital value based on the phase difference and the duty cycle. For example, the digital value corresponds to PFD_data_adapted or Fine_sel in the example of FIGS. 3A and 3B. In another example, the digital value corresponds to PFD_data_adapted in the example of FIGS. 5A and 5B. The method 700 continues in block 708 with controlling an ON-time of a switch of the voltage converter 104 based on the digital value. For example, the digital value controls an ON-time of a switch of the voltage converter 104 by controlling a delay (e.g., duration of the ON-time) implemented by one or more pulse generators 310, 312. By varying the digital value as a function of duty cycle of the voltage converter 104, the digital value generated for a particular phase difference differs based on the duty cycle of the voltage converter 104. As described above, this reduces the frequency response variation of the control loop of the digital OTG controller 102 over a wider range of duty cycle ratios.

In this description, the term "couple" may cover connections, communications, or signal paths that enable a functional relationship consistent with this description. For example, if device A generates a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components illustrated as resistors, unless otherwise stated, are generally representative of any one or more elements coupled in series and/or parallel to provide an amount of impedance represented by the illustrated resistor. For example, a resistor or capacitor illustrated and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

Modifications are possible in the described examples, and other examples are possible, within the scope of the claims.

What is claimed is:
1. An apparatus, the apparatus comprising:
a phase frequency detector having a detector output and first and second inputs, the phase frequency detector configured to provide a phase difference signal at the detector output responsive to the first and second inputs;

a gain controller having a controller input and a controller output, the controller input coupled to the detector output, and the gain controller configured to provide a digital value at the controller output responsive to the phase difference signal and a duty cycle; and a pulse generator having a generator output and first and second generator inputs, the first generator input coupled to the controller output, the second generator input coupled to the second detector input, the pulse generator configured to provide a generator signal at the generator output responsive to the digital value and the second generator input.

2. The apparatus of claim 1, wherein:
the phase frequency detector is configured to provide the phase difference signal at the detector output responsive to a comparison between:
  a first frequency of a signal at the first detector input; and
  a second frequency of a signal at the second detector input; and
the first detector input is adapted to be coupled to a reference clock.

3. The apparatus of claim 1, further comprising:
a time-to-digital converter having a converter input and a converter output, the converter input coupled to the detector output, the converter output coupled to the controller input, the time-to-digital converter configured to provide a digital indication of the phase difference at the converter output responsive to the phase difference signal, wherein the gain controller is configured to provide the digital value at the controller output responsive to the digital indication of the phase difference; and
a digital filter having a filter input and a filter output, the filter input coupled to the controller output to receive the digital value, the filter output coupled to the first generator input, the digital filter configured to provide an accumulated digital value at the filter output by adding the digital value to or subtracting the digital value from a stored digital value;
wherein the pulse generator is configured to provide the generator signal at the generator output responsive to the accumulated digital value and the second generator input.

4. The apparatus of claim 1, wherein the controller input is a first controller input, the apparatus further comprising:
a duty cycle detector having a duty cycle input and a duty cycle output, the duty cycle input adapted to be coupled to a voltage converter, the duty cycle output coupled to a second controller input of the gain controller, the duty cycle detector configured to provide an indication of whether the duty cycle of the voltage converter is above or below a threshold;
wherein the gain controller is further configured to, for a particular phase difference value:
  responsive to the indication of the duty cycle being below the threshold, provide the digital value having a first value; and
  responsive to the indication of the duty cycle being above the threshold, provide the digital value having a second value;
  wherein the second value is greater than the first value.

5. The apparatus of claim 4, wherein the digital value is a first digital value, the generator signal is a first generator signal, the pulse generator is a first pulse generator, and the gain controller is configured to provide a second digital value responsive the phase difference and the duty cycle, the apparatus further comprising:
a second pulse generator having a first input coupled to the controller output, a second input coupled to the first pulse generator output, and an output, the second pulse generator configured to provide a second generator signal at the second pulse generator output responsive to the first generator signal and the second digital value;
wherein the gain controller is further configured to, for a particular phase difference value:
  responsive to the indication of the duty cycle being below the threshold, provide the second digital value having a third value; and
  responsive to the indication of the duty cycle being above the threshold, provide the second digital value having a fourth value;
  wherein the fourth value is greater than the third value.

6. The apparatus of claim 4, wherein the duty cycle detector includes:
a comparator having a comparator output and first and second comparator inputs, the comparator output coupled to the second controller input, the first comparator input adapted to receive an output voltage of the voltage converter, and the second comparator input adapted to receive a fraction of an input voltage of the voltage converter.

7. The apparatus of claim 1, further comprising a latch having a set input, a reset input, and a latch output, wherein:
the latch output is adapted to be coupled to a power stage of a voltage converter, the second detector input, and the second generator input;
the reset input coupled to the generator output; and
the set input adapted to receive an indication of a circuit variable of the voltage converter.

8. The apparatus of claim 7, wherein the latch is configured to:
assert the latch output responsive to the circuit variable being below a threshold; and
de-assert the latch output responsive to the generator signal being asserted.

9. A system, comprising:
a power stage of a voltage converter, the power stage comprising:
  a high-side switch adapted to be coupled to an input voltage source;
  a low-side switch coupled to the high-side switch and to a ground terminal; and
  a control circuit configured to control the high-side switch and the low-side switch; and
an apparatus coupled to the power stage, the apparatus comprising:
  a phase frequency detector having a detector output and first and second inputs, the phase frequency detector configured to provide a phase difference signal at the detector output responsive to a reference clock signal received at the first input and a high-side ON signal received at the second input, the high-side ON signal also provided to the control circuit;
  a gain controller having a controller input and a controller output, the controller input coupled to the detector output, and the gain controller configured to:
    provide a first digital value at the controller output based on the phase difference signal; and provide a second digital value at the controller output based on the phase difference signal and a duty cycle of the voltage converter;

a first pulse generator having first and second inputs and an output, the first input of the first pulse generator coupled to the controller output, the second input of the first pulse generator adapted to receive the high-side ON signal, the first pulse generator configured to provide a first generator signal at the first pulse generator output responsive to the high-side ON signal and the first digital value; and a second pulse generator having first and second inputs and an output, the first input of the second pulse generator coupled to the controller output, the second input of the second pulse generator coupled to the output of the first pulse generator, the second pulse generator configured to provide a second generator signal at the second pulse generator output responsive to the first generator signal and the second digital value.

10. The system of claim 9, wherein:
the phase frequency detector is configured to provide the phase difference signal at the detector output responsive to a comparison between:
   a first frequency of the reference clock signal; and
   a second frequency of the high-side ON signal; and
the high-side ON signal is configured to trigger a high-side period of the voltage converter.

11. The system of claim 9, wherein the apparatus includes:
a time-to-digital converter having a converter input and a converter output, the converter input coupled to the detector output, the converter output coupled to the controller input, the time-to-digital converter configured to provide a digital indication of the phase difference at the converter output responsive to the phase difference signal, wherein the gain controller is configured to provide the first and second digital values at the controller output responsive to the digital indication of the phase difference; and a digital filter having a filter input and a filter output, the filter input coupled to the controller output to receive the first digital value, the filter output coupled to the first input of the first pulse generator, the digital filter configured to provide an accumulated digital value at the filter output by adding the first digital value to or subtracting the first digital value from a stored digital value;

wherein the first pulse generator is configured to provide the generator signal at the generator output responsive to the accumulated digital value and the second input of the first pulse generator.

12. The system of claim 9, wherein the controller input is a first controller input, the system further comprising:
a duty cycle detector having a duty cycle input and a duty cycle output, the duty cycle input adapted to be coupled to the voltage converter, the duty cycle output coupled to a second controller input of the gain controller, the duty cycle detector configured to provide an indication of whether the duty cycle of the voltage converter is in a first range, a second range, or a third range;

wherein the gain controller is further configured to, for a particular phase difference value:
   responsive to the indication of the duty cycle being in the first range, provide the second digital value having a first value;
   responsive to the indication of the duty cycle being in the second range, provide the second digital value having a second value; and
   responsive to the indication of the duty cycle being in the third range, provide the second digital value having a third value;
   wherein the third value is greater than the second value, which is greater than the first value.

13. The system of claim 12, wherein the gain controller is further configured to, for a particular phase difference value:
   responsive to the indication of the duty cycle being in the first range, provide the first digital value having a fourth value;
   responsive to the indication of the duty cycle being in the second range, provide the first digital value having a fifth value; and
   responsive to the indication of the duty cycle being in the third range, provide the first digital value having a sixth value;
   wherein the sixth value is greater than the fifth value, which is greater than the fourth value.

14. The system of claim 12, wherein the duty cycle detector includes:
   a first comparator having a first comparator output coupled to the second controller input, and first and second inputs adapted to receive an output voltage of the voltage converter and a first fraction of an input voltage of the input voltage source; and
   a second comparator having a second comparator output coupled to the second controller input, and first and second inputs adapted to receive the output voltage of the voltage converter and a second fraction of the input voltage of the input voltage source.

15. The system of claim 9, wherein the apparatus includes a latch having a set input, a reset input, and a latch output, wherein:
   the latch output is coupled to the control circuit of the voltage converter, to the second detector input, and to the second generator input of the first pulse generator;
   the reset input coupled to the second pulse generator output; and
   the set input adapted to receive an indication of a circuit variable of the voltage converter.

16. The system of claim 15, wherein the latch is configured to:
   assert the latch output responsive to the circuit variable being below a threshold; and
   de-assert the latch output responsive to the second generator signal being asserted.

17. A method of controlling a voltage converter, the method comprising:
   determining a phase difference between a first signal and a second signal;
   determining a duty cycle of the voltage converter;
   generating a digital value based on the phase difference and the duty cycle; and
   controlling an ON-time of a switch of the voltage converter based on the digital value.

18. The method of claim 17, wherein:
the first signal is generated by a reference clock;
the switch is adapted to be coupled to an input voltage source; and
the second signal is configured to trigger a high-side period of the voltage converter;
the method further comprising, for a particular phase difference value:

responsive to an indication of the duty cycle being below a threshold, generating the digital value having a first value; and responsive to the indication of the duty cycle being above the threshold, generating the digital value having a second value;

wherein the second value is greater than the first value.

19. The method of claim 17, wherein:

the first signal is generated by a reference clock;

the switch is coupled to a ground terminal; and the second signal is configured to trigger a low-side period of the voltage converter;

the method further comprising, for a particular phase difference value:

responsive to an indication of the duty cycle being below a threshold, generating the digital value having a first value; and responsive to the indication of the duty cycle being above the threshold, generating the digital value having a second value;

wherein the first value is greater than the second value.

20. The method of claim 17, wherein:

the first signal is generated by a reference clock;

the switch is a high-side switch; and the second signal is configured to trigger a high-side period of the voltage converter;

the method further comprising, for a particular phase difference value:

responsive to an indication of the duty cycle being in a first range, generating the digital value having a first value;

responsive to the indication of the duty cycle being in a second range, generating the digital value having a second value; and responsive to the indication of the duty cycle being in a third range, generating the digital value having a third value;

wherein the third value is greater than the second value, which is greater than the first value.

* * * * *